(12) United States Patent
Powers et al.

(10) Patent No.: US 7,601,946 B2
(45) Date of Patent: Oct. 13, 2009

(54) ELECTROMAGNETIC SENSOR INCORPORATING QUANTUM CONFINEMENT STRUCTURES

(75) Inventors: Richard M. Powers, Lakewood, CO (US); Wil McCarthy, Lakewood, CO (US); Paul Ciszek, Lakewood, CO (US)

(73) Assignee: RavenBrick, LLC, Denver, CO (US)

( * ) Notice: Subject to any disclaimer, the term of this patent is extended or adjusted under 35 U.S.C. 154(b) by 26 days.

(21) Appl. No.: 11/854,300

(22) Filed: Sep. 12, 2007

(65) Prior Publication Data

US 2008/0061222 A1 Mar. 13, 2008

Related U.S. Application Data

(60) Provisional application No. 60/825,385, filed on Sep. 12, 2006, provisional application No. 60/825,405, filed on Sep. 12, 2006.

(51) Int. Cl.
*H01J 40/14* (2006.01)
(52) U.S. Cl. .................... 250/226; 250/227.21
(58) Field of Classification Search ................ 250/226, 250/227.21, 227.11, 214.1, 214 R, 239; 372/26, 372/27, 12, 15, 16, 45.01, 43.01, 50.21; 257/13–15; 359/244–248, 260, 298
See application file for complete search history.

(56) References Cited

U.S. PATENT DOCUMENTS

| | | | |
|---|---|---|---|
| 5,274,246 A | 12/1993 | Hopkins et al. | |
| 5,347,140 A | 9/1994 | Hirai et al. | |
| 5,530,263 A | 6/1996 | DiVincenzo | |

(Continued)

FOREIGN PATENT DOCUMENTS

GB 2261989 11/1991

(Continued)

OTHER PUBLICATIONS

Black, C.T., et al., "Integration of self-assembled diblock copolymers for semiconductor capacitor fabrication," Applied Physics Letters, vol. 79, No. 3 (Jul. 16, 2001), pp. 409-411, (American Inst. of Physics, NY).

(Continued)

*Primary Examiner*—Que T Le
(74) *Attorney, Agent, or Firm*—Dorsey & Whitney LLP

(57) ABSTRACT

A multispectral optical sensor incorporating quantum confinement devices is composed of a solid-state tunable filter, an optional lens, and a photodetector or plurality of photodetectors. The tunable filter is multilayered composite film of semiconducting materials, which includes a quantum well or other quantum confinement structure and barrier materials to ensure the proper confinement of charge carriers within the quantum well. The tunable filter is capable of acting as a long-pass filter. The approximate cut-on wavelength is established through selection of a well material with a bandgap near the desired energy, and barrier materials with a higher bandgap. For a given reference temperature the exact cut-on wavelength may be fixed through careful selection of the dimensions of the quantum confinement structures, whose quantum confinement energy is added to the bandgap energy to yield the cut-on energy. The operational cut-on wavelength at any given moment may be controlled through variation of the temperature of the tunable filter using onboard or external thermal control hardware and through control of an electric field applied across the filter.

23 Claims, 5 Drawing Sheets

U.S. PATENT DOCUMENTS

| | | | |
|---|---|---|---|
| 5,585,640 A | | 12/1996 | Huston et al. |
| 5,757,828 A | * | 5/1998 | Ouchi .................. 372/27 |
| 5,763,307 A | | 6/1998 | Wang et al. |
| 5,881,200 A | | 3/1999 | Burt |
| 5,889,288 A | | 3/1999 | Futatsugi |
| 5,937,295 A | | 8/1999 | Chen et al. |
| 6,040,859 A | | 3/2000 | Takahashi |
| 6,240,114 B1 | | 5/2001 | Anselm et al. |
| 6,281,519 B1 | | 8/2001 | Sugiyama et al. |
| 6,294,794 B1 | | 9/2001 | Yoshimura et al. |
| 6,304,784 B1 | | 10/2001 | Allee et al. |
| 6,320,220 B1 | | 11/2001 | Watanabe et al. |
| 6,329,668 B1 | | 12/2001 | Razeghi |
| 6,333,516 B1 | | 12/2001 | Katoh et al. |
| 6,437,361 B1 | | 8/2002 | Matsuda |
| 6,498,354 B1 | | 12/2002 | Jefferson et al. |
| 6,512,242 B1 | | 1/2003 | Fan et al. |
| 6,600,169 B2 | | 7/2003 | Stintz et al. |
| 6,611,640 B2 | | 8/2003 | LoCasclo et al. |
| 6,777,718 B2 | | 8/2004 | Takagi |
| 6,816,525 B2 | | 11/2004 | Stintz et al. |
| 6,946,697 B2 | | 9/2005 | Pietambaram et al. |
| 6,978,070 B1 | | 12/2005 | McCarthy et al. |
| 7,026,641 B2 | | 4/2006 | Mohseni et al. |
| 7,470,925 B2 | | 12/2008 | Tamura et al. |
| 2002/0080842 A1 | | 6/2002 | An et al. |
| 2002/0152191 A1 | | 10/2002 | Hollenberg et al. |
| 2002/0190249 A1 | | 12/2002 | Williams et al. |
| 2003/0059998 A1 | | 3/2003 | Holonyak et al. |
| 2003/0066998 A1 | | 4/2003 | Lee |
| 2003/0107927 A1 | | 6/2003 | Yerushalmi et al. |
| 2004/0256612 A1 | | 12/2004 | Mohseni et al. |
| 2005/0157996 A1 | | 7/2005 | McCarthy et al. |
| 2005/0157997 A1 | | 7/2005 | McCarthy et al. |
| 2006/0011904 A1 | | 1/2006 | Snyder et al. |
| 2006/0049394 A1 | | 3/2006 | Snyder et al. |
| 2006/0151775 A1 | | 7/2006 | Hollenberg et al. |

FOREIGN PATENT DOCUMENTS

| | | |
|---|---|---|
| JP | 10-260381 | 9/1998 |
| JP | 2003-248204 | 9/2003 |
| KR | 10-2002-0013986 | 2/2002 |

OTHER PUBLICATIONS

Goldhaber-Gordon, David, et al., "Overview of Nanoelectronic Devices," Proceedings of the IEEE, vol. 85, No. 4, (Apr. 1997) pp. 521-533.

Kastner, Marc A., "Artificial Atoms," Physics Today (Jan. 1993), American Institute of Physics.

Kouwenhoven, Leo, et al., "Quantum Dots," Physics World, (Jun. 1988), pp. 35-39.

Leatherdale, C.A., et al., "Photoconductivity in CdSe Quantum Dot Solids," Physical Review B, vol. 62, No. 4, (Jul. 15, 2000) pp. 2669-2680.

McCarthy, Wil, "Once Upon a Matter Crushed," Science Fiction Age (Jul. 1999).

McCarthy, Wil, "Programmable Matter," Nature, vol. 407 No. 127, (Oct. 5, 2000).

McCarthy, Wil, "The Collapsium," Orion Books (2000).

Ryu, Du Yeol et al., "A Generalized Approach to the Modification of Solid Surfaces," Science, vol. 308 (Apr. 8, 2005), pp. 236-239.

Soh, Hyongsok T. et al., "Scanning Probe Lithography," Ch. 3, (2001) pp. 44-66 (Kluwer Academic Publishers).

Turton, Richard, "The Quantum Dot: A Journey into the Future of Microelectronics," Oxford University Press (1995).

Xu, Ting et al., "The Influence of Molecular Weight on Nanoporous Polymer Films," Polymer, 42 (Apr. 3, 2001), pp. 9091-9095 (Elsevier Science Ltd).

Orlov, Alexei O., et al., Clocked Quantum-Dot Cellular Automata Devices: Experimental Studies, IEEE-NANO 2001, Oct. 30, 2001, pp. 425-430.

* cited by examiner

ELECTROMAGNETIC SENSOR INCORPORATING QUANTUM CONFINEMENT STRUCTURES

PRIORITY CLAIM

This application claims priority pursuant to 35 U.S.C. 119 (e) to U.S. provisional application Nos. 60/825,385 and 60/825,405, both filed 12 Sep. 2006, each of which is hereby incorporated herein by reference in its entirety.

BACKGROUND

The fabrication of very small structures to exploit the quantum mechanical behavior of charge carriers e.g., electrons or electron "holes" is well established. Quantum confinement of a charge carrier can be accomplished by a structure whose dimension is less than the quantum mechanical wavelength of the carrier. Confinement in a single dimension produces a quantum well, and confinement in two dimensions produces a quantum wire, while a quantum dot is a structure capable of confining charge carriers in all three dimensions.

Quantum confinement effects may be observed in films or other structures with dimensions less than the charge carrier de Broglie wavelength, the electron-hole Bohr diameter, the charge carrier inelastic mean free path, and the ionization diameter, i.e., the diameter at which the charge carrier's quantum confinement energy is equal to its thermal-kinetic energy. It is postulated that the strongest confinement may be observed when all of these criteria are met simultaneously. Such structures may be composed of semiconductor materials (for example, Si, GaAs, AlGaAs, InGaAs, InAlAs, InAs, and other materials), or of metals, and may or may not possess a solid insulative barrier.

Typically, a quantum well consists of a conducting or semi-conducting film, anywhere from a few nanometers to a few tens of nanometers thick, surrounded by barrier materials. At cryogenic temperatures, quantum confinement can be achieved using a thicker well structure.

A quantum dot is a structure capable of confining charge carriers in all three dimensions. Quantum dots can be formed as particles, with a dimension in all three directions of less than the de Broglie wavelength of a charge carrier. Quantum confinement effects may also be observed in particles of dimensions less than the electron-hole Bohr diameter, the charge carrier inelastic mean free path, and the ionization diameter, i.e., the diameter at which the charge carrier's quantum confinement energy is equal to its thermal-kinetic energy. It is postulated that the strongest confinement may be observed when all of these criteria are met simultaneously. Such particles may be composed of semiconductor materials (for example, Si, GaAs, AlGaAs, InGaAs, InAlAs, InAs, and other materials), or of metals, and may or may not possess an insulative coating. Such particles are referred to in this document as "quantum dot particles."

A quantum dot can also be formed inside a semiconductor substrate through electrostatic confinement of the charge carriers. This is accomplished through the use of microelectronic devices of various design, e.g., an enclosed or nearly enclosed gate electrode formed on top of a quantum well. Here, the term "micro" means "very small" and usually expresses a dimension of or less than the order of microns (thousandths of a millimeter). The term "quantum dot device" refers to any apparatus capable of generating a quantum dot in this manner. The generic term "quantum dot," abbreviated "QD" in certain of the drawings herein, refers to the confinement region of any quantum dot particle or quantum dot device.

The electrical, optical, thermal, magnetic, mechanical, and chemical properties of a material depend on the structure and excitation level of the electron clouds surrounding its atoms and molecules. Doping is the process of embedding precise quantities of carefully selected impurities in a material in order to alter the electronic structure of the surrounding atoms, for example, by donating or borrowing electrons from them, and therefore altering the material's electrical, optical, thermal, magnetic, mechanical, or chemical properties. Impurity levels as low as one dopant atom per billion atoms of substrate can produce measurable deviations from the expected behavior of a pure crystal, and deliberate doping to levels as low as one dopant atom per million atoms of substrate are commonplace in the semiconductor industry, for example, to alter the conductivity of a semiconductor.

Kastner, "Artificial Atoms," Physics Today (January 1993), points out that the quantum dot can be thought of as an "artificial atom," since the charge carriers confined in it behave similarly in many ways to electrons confined by an atomic nucleus. The term "artificial atom" is now in common use, and is often used interchangeably with "quantum dot." However, for the purposes of this document, "artificial atom" refers specifically to the pattern of confined carriers, e.g., an electron gas, and not to the particle or device in which the carriers are confined. Kastner describes the future potential for "artificial molecules" and "artificial solids" composed of quantum dot particles. Specifics on the design and function of these molecules and solids are not provided.

Quantum dots can have a greatly modified electronic structure from the corresponding bulk material, and therefore different properties. Quantum dots can also serve as dopants inside other materials. Because of their unique properties, quantum dots are used in a variety of electronic, optical, and electro-optical devices. Quantum dots are currently used as near-monochromatic fluorescent light sources, laser light sources, light detectors including infra-red detectors, and highly miniaturized transistors, including single-electron transistors. Quantum dots can also serve as a useful laboratory for exploring the quantum mechanical behavior of confined carriers. Many researchers are exploring the use of quantum dots in artificial materials, and as dopants to affect the optical and electrical properties of semiconductor materials.

IR/optical filters and switches currently exist. Light can be blocked by filters which absorb or reflect certain frequencies while allowing others to pass through. Shortpass and long-pass filters may be used, or a narrow range of frequencies can be blocked by a notch filter or bandblock filter, or transmitted by a bandpass filter.

The addition of a mechanical shutter can turn an otherwise transparent material—including a filter—into an optical switch. When the shutter is open, light passes through easily. When the shutter is closed, no light passes. If the mechanical shutter is replaced with an electrodarkening material such as a liquid crystal, then the switch is "nearly solid state," with no moving parts except photons, electrons, and the liquid crystal molecules themselves. This principle is used, for example, in liquid crystal displays (LCDs), where the white light from a backdrop is passed through colored filters and then selectively passed through or blocked by liquid crystal materials controlled by a transistor. The result is a two-dimensional array of colored lights which form the pixels of a television or computer display.

Thermochromic materials also exist, which change their color (i.e., their absorption and reflection spectrum) in response to temperature. Liquid crystal thermometers are based on this principle, and thermochromic plastics are sometimes incorporated into baby bathtubs as a visual indicator of water that may be too hot or too cold for safety or comfort. Thermochromic paints are sometimes used to help regulate the temperature of objects or buildings under heavy sunlight.

Tunable filters are also available which rely on various mechanical principles such as the piezoelectric squashing of a crystal or the rotation or deformation of a lens, prism, or mirror, in order to affect the filter's optical properties. Most notable of these is the Fabry-Perot interferometer, also known as an etalon. Like any mechanical device, such tunable filters are much more vulnerable to shock, vibration, and other related failure modes than any comparable solid-state device.

Imaging sensors that incorporate etalon-based tunable filters are sometimes used in remote sensing applications, e.g., on spacecraft or telescopes. Two fundamental drawbacks of such filtering systems are: 1) that target object must be placed precisely in a very small part of the field, thus the filtered observations are only a small portion of the available field of view; and 2) the added mass, volume, and reliability costs associated with mechanically controlling the etalon.

The information included in this Background section of the specification, including any references cited herein and any description or discussion thereof, is included for technical reference purposes only and is not to be regarded as subject matter by which the scope of the invention is to be bound.

SUMMARY

An optical sensor is disclosed herein, which incorporates a solid-state tunable filter that uses quantum confinement to control its optical properties. The sensor may include a single photodetector or photodetector array, an optional lens or plurality of lenses, a solid-state tunable filter, and any other components and supporting hardware that would normally or usefully be found in an optical sensor. Such supporting hardware may include, but is not limited to, housings, apertures, mirrors, prisms, shutters, filters, power sources, control electronics, data storage, and computing. The tunable filter may be a solid-state device or component with an input path through which unfiltered light enters, an output path through which filtered light exits, and a semiconductor filter material. The tunable filter device may use any combination of temperature, electric fields, and quantum confinement devices to regulate the effective bandgap of the filter material, and therefore to adjust the transition or cut-on wavelength or wavelengths at which the filter material ceases to reflect or absorb light, and instead transmits it.

One exemplary implementation of an optical sensor may include a tunable filter formed as a composite film or sandwich of heterogeneous materials composed of, or incorporating, quantum confinement structures—e.g., quantum wells, quantum wires, quantum dot particles, or electrostatic quantum dot devices—that alter the optical properties of the sandwich, thus affecting the flow of light through the composite film. The composite film may include multiple quantum confinement layers and may be attached to a transparent substrate for structural or other reasons. When the temperature of the tunable filter device is altered (for example, by the use of solid-state heaters and thermoelectric coolers, one or more temperature sensors, and a thermostat circuit), or when an electric field is placed across the quantum confinement devices, the cut-on energy changes and thus alters the optical response of the tunable filter. When successive images are taken using different cut-on wavelengths in the tunable filter, spectral information about the incoming light (including the pixel-by-pixel spectrum of a detailed image) may be gathered for analysis.

Although the structure and composition of the tunable filter, and the quantum confinement structures embedded within it, may produce peaks or bands of absorption or transmission in certain regions of the spectrum (i.e., a bandpass or bandblock filter), in the general case the tunable filter may act as a long-pass filter. As a long-pass filter, the room-temperature edge or cut-on wavelength is determined by the dimensions and composition of the quantum confinement structures (e.g., a quantum well of known thickness). Further, the operational cut-on wavelength of the tunable filter may be set dynamically through control of the temperature of the tunable filter and/or through the application of an electric field. This electric field may be applied, for example, by placing a conductive electrode and ground plane on opposite sides of the tunable filter, and then applying an electrical voltage between them.

In some embodiments, the tunable filter may include multiple well and barrier layers, as in a superlattice. In other embodiments, the quantum well layer may be replaced with a layer containing an arrangement of quantum wires, which may be parallel, stacked, woven, braided, or randomly deposited. In still other embodiments, the quantum well layer may be replaced with a layer containing an arrangement of quantum dots, either particles or devices. In each of these cases, the properties of these quantum confinement devices are used to modify the bulk properties of the filter material and thus establish the optical response of the tunable filter at room temperature, or at some other specified reference temperature.

Some implementations may include only a multi-layered tunable filter itself, with control of the temperature and applied electric field—and thus the optical properties—of the tunable filter may be accomplished by an external control system. Other embodiments may include means for controlling the temperature of the tunable filter (e.g., via cooling devices, heating devices, temperature sensors, and thermostats, or thermal control circuits) or the applied electric field (e.g., via electrodes, ground planes, wires, or a voltage source). In some embodiments, all of these temperature control systems are solid-state, with no moving parts, although mechanical heaters, coolers, thermostats and voltage sources could be employed with equal efficacy. A person skilled in the art will understand that in some circumstances, it may be possible to control the temperature or electric field of the tunable filter with only some of these components. For example, cooling devices may be unnecessary in cold environments, while heating devices may be unnecessary in hot environments. It may also be possible to dispense with the temperature sensor and thermostat and regulate the optical properties of the tunable filter simply by varying the heat output or duty cycle of the heating device or devices. Many other arrangements are possible, and these examples should not be construed as limiting in scope.

In one implementation, the tunable optical sensor is capable of detecting or rejecting light over a broad range of possible wavelengths.

In another implementation, the optical sensor may be a programmable sensor whose light-detecting properties can be controlled externally, through the application of electrical energy to heaters, coolers, and electrodes, or through command signals to a temperature controller or a voltage controller.

In a further implementation, the optical sensor may be a simple photodetector, but may also be a complex imaging sensor (for example, a charge coupled device (CCD) digital camera). The addition of a tunable filter to an imaging sensor makes it a multispectral sensor, capable of measuring the emission or reflection spectrum of the objects or materials it is imaging, and thus gaining significant information about their composition, temperature, or (in the case of man-made devices) their design and operation (e.g., the spectral output of a light-emitting device). The multispectral sensor thus has particular but not exclusive application as an optical (i.e., visible light, ultraviolet, and infrared) sensor for photography, spectroscopy, remote sensing, and optical networking.

In another implementation and in contrast with an etalon filter, the solid-state tunable filter in the optical sensor does not restrict the field of view of the optical sensor, but operates over the entire field of view of the optical sensor device, as defined by its apertures and lenses.

In yet another implementation, the entire optical sensing instrument, including the tunable filter, can be constructed using solid state components. This allows the optical sensor to have a smaller mass and volume than a comparable system incorporating electromechanical or piezoelectrically actuated filters, and offers greatly improved resistance to shock, vibration, wear, fatigue, particulate interference, and spontaneous mechanical failure.

In an additional implementation, the optical sensor may function as a detector, which is also capable of generating light (for example, when fluorescing in response to short-wavelength light) or generating electricity from incident light (e.g., via the photoelectric effect), as a side effect of its normal operation.

In a further implementation, the optical sensor may be capable of achieving specific cut-on energies and detection or rejection wavelengths that do not correspond with the bandgap of any known material, and thus may be difficult to achieve through any other means.

Other features, details, utilities, and advantages of the present invention will be apparent from the following more particular written description of various embodiments of the invention as further illustrated in the accompanying drawings and defined in the appended claims.

DETAILED DESCRIPTION

Figure 1:
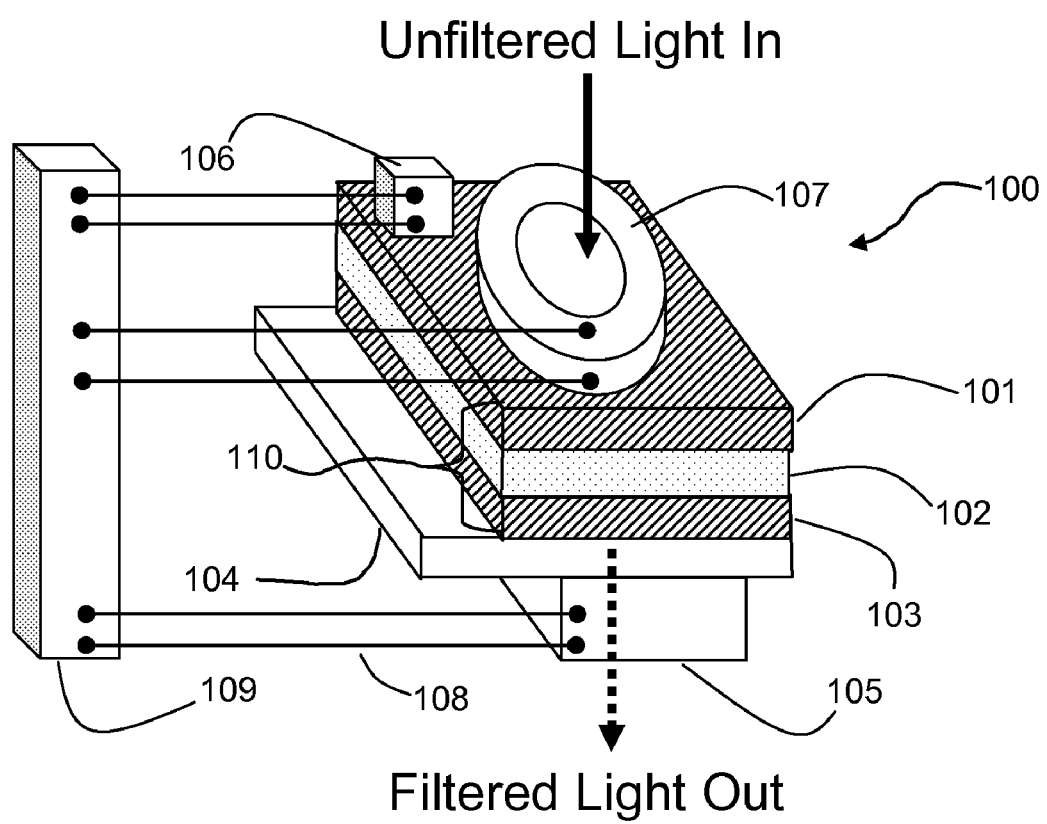
FIG. 1 is a schematic view of an implementation of a thermochromic (i.e., temperature-based) tunable filter.

Quantum confinement structures may be arranged within an optical filter so that the transition or cut—on wavelength—the wavelength above which the optical filter transmits light—is adjustable. The filtered light is then focused through a lens onto a photodetector or plurality of photodetectors to produce a signal or image based on the transmitted wavelengths and excluding the wavelengths blocked by the filter.

For the purposes of this document, the term "optical" refers to visible, ultraviolet, and infrared light which obey the normal rules of optics. By this definition, long-wavelength infrared, microwaves, radio waves, extreme ultraviolet, x-ray, and gamma radiation are not optical radiation.

Through design of the material composition and layering of the optical filter, the cut-on wavelength may be fixed at a particular, desired value for a particular reference temperature (e.g., room temperature), and is then adjustable through changes in the temperature of the optical filter and/or an electric field applied across the optical filter. The filter material may consist of one or more layers of quantum confinement structures (typically a quantum well, but alternatively layers of quantum dots or quantum wires) of precise dimension and composition, surrounded by barrier layers. Optionally, the optical filter may also include a transparent substrate for mechanical stability or other purposes. The optical filter may also include a control system, for example, in the form of heaters, coolers, temperature sensors, thermostats or thermal control circuitry, electrodes, ground planes, and voltage sources or voltage controllers, for control of the temperature of the optical filter and applied electric field across the optical filter, although the control system may alternatively or additionally be external to the optical filter.

The optical response of a semiconductor is a function of its bandgap—a material-specific quantity. For photons with energies below the bandgap, the semiconductor is generally transparent, although material-specific absorption bands may also exist. Photons with energies higher than the bandgap are capable of creating electron-hole pairs within the semiconductor, and thus are generally absorbed or reflected. Thus, a material like gallium arsenide (bandgap 1.424 eV) is transparent to infrared photons with a wavelength of 871 nanometers or greater, and opaque to visible light, whereas $SiO_2$ (bandgap ~9.0 eV) is transparent to visible and near-ultraviolet light with a wavelength greater than 138 nm. Thus, semiconductor materials are capable of serving as optical, infrared, or ultraviolet long-pass filters.

A semiconductor will also generally show a strong emission or luminescence peak at this cut-on energy, i.e., when stimulated with an electrical current or with absorbed photons of higher energy, the semiconductor material will emit photons at the cut-on energy as a result of electron-hole recombinations within the material. Photoluminescence (i.e., stimulating the material with high-frequency light and measuring the resulting fluorescence or emission spectrum) is therefore useful as a diagnostic tool, to determine the quantum confinement energy of a quantum well and thus predict its optical properties. Strong absorption at and above the cut-on energy is also capable of generating photoelectric effects within the semiconductor as large numbers of electron-hole pairs are created.

However, the energy of an electron confined in a quantum well is not only a function of bandgap but of the quantum confinement energy, which depends on the thickness of the well and the energy height of the surrounding barriers (i.e., the difference in conduction band energy between the well and barrier materials). This "bandgap plus quantum confinement" energy moves the transparency of the material into shorter wavelengths. Thus, while a bulk GaAs sample emits and absorbs photons at approximately 870 nm, a 10 nm GaAs quantum well surrounded by $Al_{0.4}Ga_{0.6}As$ barriers has a 34 meV quantum confinement energy and thus shows the same cut-on at approximately 850 nm. Therefore, for a given set of materials and a given reference temperature, the cut-on energy can be fixed precisely through the fabrication of a quantum well of known thickness. It should be noted, however, that the bandgap is a temperature-dependent quantity. As the temperature of a semiconductor decreases, its bandgap increases slightly. When the semiconductor is heated, the bandgap decreases.

At the time of manufacture, the material for the quantum confinement layer may be selected to have a bandgap near the photon energy of the desired cut-on wavelength. The barrier layers may then be selected to have a higher conduction band energy than the quantum confinement material, which in general means a larger bandgap. This ensures the quantum confinement layer is surrounded by finite (i.e., nonzero) energy barriers capable of confining charge carriers in the desired energy range, and also ensures that the energy barriers are generally transparent to photons at or near the cut-on wavelength (although material-dependent absorption peaks or bands may exist even at lower energies and/or longer wavelengths).

The dimensions of the quantum wells, wires, or dots in the quantum confinement layer of the optical sensor may then be selected such that the quantum confinement energy of the confined carriers, added to the bandgap energy of the well material, yields a cut-on frequency at exactly the desired value for the reference temperature. Depending on the materials and desired energies/wavelengths, this dimension may be anywhere from less than a nanometer to several tens of nanometers, or even several microns for devices intended to operate at cryogenic temperatures. In the more typical case, for room-temperature optical sensor devices made of common semiconductor materials and operating in the visible, near-infrared, and near-ultraviolet wavelengths, thicknesses between 2 nm and 20 nm may be the most common.

The tunable filter may then be operated by adjusting its temperature with a control system. At higher temperatures, the bandgap and the cut-off energy (i.e., the bandgap+quantum confinement energy) both decrease, resulting in a larger cut-off wavelength. In other words, the filter becomes opaque to certain frequencies where it had previously been transparent. When the temperature of the tunable filter is reduced, the opposite happens: the bandgap and cut-off energy increase, the cut-off wavelength becomes smaller, and the tunable filter becomes transparent at wavelengths where it had previously been opaque. In a similar way, an electrostatic tunable filter in an optical sensor may be operated by adjusting the electric field applied across it.

A photodetector array may produce a voltage, signal, or stored charge in response to photons within a desired range of energies and wavelengths. This range is a function of the composition and design of the photodetector device. However, in general the photodetector will respond to any photon within this range, whether it represents a desirable signal or not. The purpose of the optical filter is to restrict the transmission of certain wavelengths to the detector. For example, color CCD cameras typically include a short-pass filter, which allows visible light to pass through, but blocks the passage of near infrared light that would upset the color balance of the image. The optical filter described herein may be a solid-state tunable long-pass filter whose cut-on wavelength can be adjusted dynamically.

FIG. 1 is a schematic view of a thermochromic tunable filter device 100 incorporating thermochromic filter 110 in the form of a quantum well layer 102 surrounded by an upper barrier layer 101 and a lower barrier layer 103, and attached to an optional transparent substrate 104. It may be desirable to place transparent substrates on both sides of the thermochromic filter 110 in order to stabilize and protect it. Alternatively, since the barrier layers 101, 103 must be transparent to light in the operating range of the thermochromic filter 110, they may also serve as substrates on one or both sides of the quantum well material 102. In other words, the barrier layer 103 and the substrate 104 may in fact be a single layer composed of a single material. In fact, the upper barrier layer 101 is also optional, since confined charge carriers are not generally capable of escaping the well into free space (i.e., free space, whether air, vacuum, or some other medium, generally presents a very large barrier in its own right). However, the well layer 102 may typically be only a few nanometers thick and can therefore be damaged by even casual contact with other materials. Therefore, the addition of the barrier layer 101 and/or the transparent substrate layer 104 may be advantageous for most applications where tunable filters are used.

It should be realized that the quantum well layer 102 may be formed as a layer of quantum wires or quantum dots in order to increase the quantum confinement energy of the quantum well layer 102 without increasing the thickness, or for other reasons relating to the specific application for which the thermochromic filter device 100 is to be used. In either case, unfiltered light enters through the top of the thermochromatic filter device 100 and is modified by the thermochromic filter 110, so that filtered light exits through the lower surface of the thermochromatic filter device 100.

In addition, a control system, for example, a heating device 105, a temperature sensor 106, and a cooling device 107 may be attached to the thermochromic filter 110. In one embodiment these devices may be annular in shape and/or may be located around the periphery of the thermochromic filter 110, so as not to block the light passing through the center of the thermochromic filter 110. In addition, although mechanical heat pumps and thermometers may be used as part of a control system, the heater 105, the cooler 107, and the temperature sensor 106 may all be solid-state devices with no moving parts, other than electrons. For example, a control system with a thermocouple acting as the temperature sensor 106, a resistive heating element (e.g., a power resistor) acting as the heater 105, and a thermoelectric cooler ((TEC), e.g., a Peltier junction, a Peltier-seebeck junction, or a Thompson effect device) acting as a cooling device 107, the thermochromic filter 110 may be adjustable over a broad range of temperatures.

The heating device 105, cooling device 107, and temperature-sensing device 106 may be connected by wires 108 to a temperature-regulating device 109, which reads the temperature of the thermochromic filter 110 and adjusts the output of the heating device 105 or the cooling device 107 appropriately in order to keep the thermochromic filter 110 at a particular desired temperature, and thus a particular cut-on wavelength. The temperature-regulating device 109 may be a solid-state thermostat or thermal control circuit.

It should be understood that the optical sensor devices disclosed herein may include any necessary or convenient supporting hardware, such as solder, adhesives, or mechanical attachments to hold the hardware in place on the thermochromic filter 110; thermal gaskets, seals, connectors or heat sink compounds to improve heat flow between the heating devices 105 and the cooling devices and the thermochromic filter material; and/or a heat sink or heat pump attached to the thermoelectric cooler to maximize its ability to transport heat away from the thermochromic filter 110. It should also be understood that for some applications, adequate thermal control may be achieved with some of these components absent, non-operational, or external to the thermochromic filter device 100.

It may further be recognized that the thermochromic filter 110 may also function with the quantum confinement layer 102 deleted. In this case the cut-on wavelength of the semiconductor can still be adjusted through changes in its temperature, but the nominal value at the reference temperature cannot be selected at the time of manufacture, but rather will be determined exclusively by the bandgap of the material forming the thermochromic filter 100. Numerous other variations exist which may alter the design or appearance of the device without affecting its basic operation or underlying principles. The configuration shown in FIG. 1 is for exemplary purposes only, and should not be construed as limiting in scope.

Figure 2:
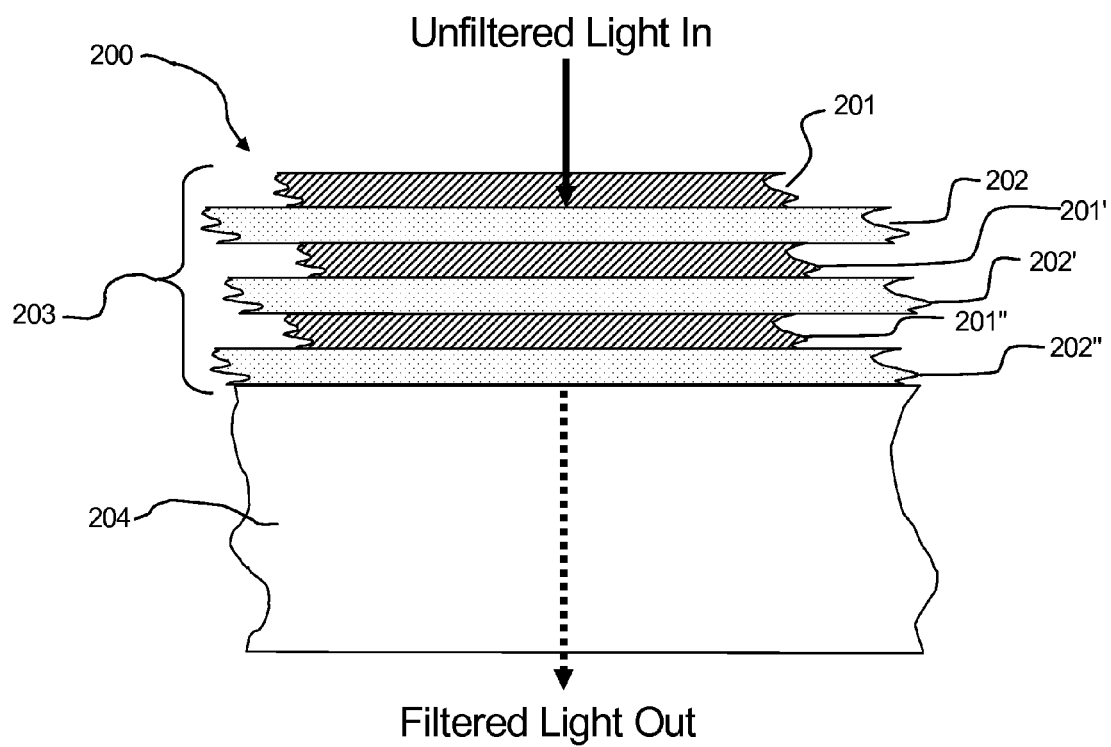
FIG. 2 is a schematic representation of an alternate implementation of a tunable filter material incorporating multiple quantum well and barrier layers.

FIG. 2 is a schematic representation of another implementation of a thermochromic filter device 100 incorporating multiple quantum well layers 202, 202', 202" and barrier layers 201, 201', 201" supported on an optional transparent substrate 204. This increases the total thickness of the active region of the thermochromic filter 203 without altering the thickness (and thus the quantum confinement energy) of any given quantum well layer 202, 202', 202". As in FIG. 1, unfiltered light enters through the top of the thermochromic filter device 200, interacts with the barrier and quantum well layers 201 and 202, and passes through the optional substrate layer 204, so that filtered light, excluding wavelengths below the cut-on wavelength, exits from the lower surface of the thermochromic filter device 200. In this embodiment, the control system for regulating the temperature of the thermochromic filter 203 may be external to the thermochromic filter device 200, and thus is not shown.

It should be realized that it may be desirable for these multiple quantum well layers 202, 202', 202" to have different thicknesses, or possibly even different compositions from one another, in order to set certain parameters of the thermochromic filter 203, such as the slope of its transmission spectrum near the cut-on wavelength. Thus, the filtering properties of the tunable thermochromatic filter device 200 may be enhanced, reducing its transmissivity to unwanted wavelengths, with no effect on its nominal cut-on energy or cut-on wavelength, or its transparency to desirable wavelengths. It may also be desirable for some or all of these well layers to be replaced with layers of quantum dots or quantum wires, not necessarily identical to one another in dimension or composition. However, use of quantum dots or quantum wires or quantum wires does not fundamentally change the thermochromic filtering device 200.

It should be recognized that multiple quantum confinement layers can be arranged to form an interference filter, i.e., an optical filter that reflects a particular spectral band or group of spectral lines and transmits all others (except possibly harmonics). This has been accomplished in the past by alternating layers of material that have thicknesses that are ½ the wavelength of the light to be reflected, with materials properties such that constructive interference occurs between the light scattered by each layer. Such filters are reflective due to the interference effects that occur between incident and reflective waves at the boundaries.

By alternating layers of quantum wells and barriers as described herein, interference effects on electromagnetic radiation are demonstrable, and the semiconductor bandgaps of such a layered structure may be changed by varying the temperature of the layers, and/or by varying a voltage placed across the layers (for example, via the Stark effect). Changes in bandgap provide tunable wavelength selection around the nominal wavelength of the system. Similarly, it is possible to tune the absorptive and transmissive properties of the system using temperature and voltage effects. Additionally, varying the temperature of the quantum wells may directly affect the lattice spacing and index of refraction, affecting the reflectance, adsorption, and transmission properties of the material and thus the spectral band of the interference filter. The reflection band of such a tunable system may be Gaussian in shape, allowing the filter to serve as a notch or bandblock filter in a transmissive mode. In addition, the light reflected from the interference filter may behave as though it has passed through a bandpass filter.

Figure 3:
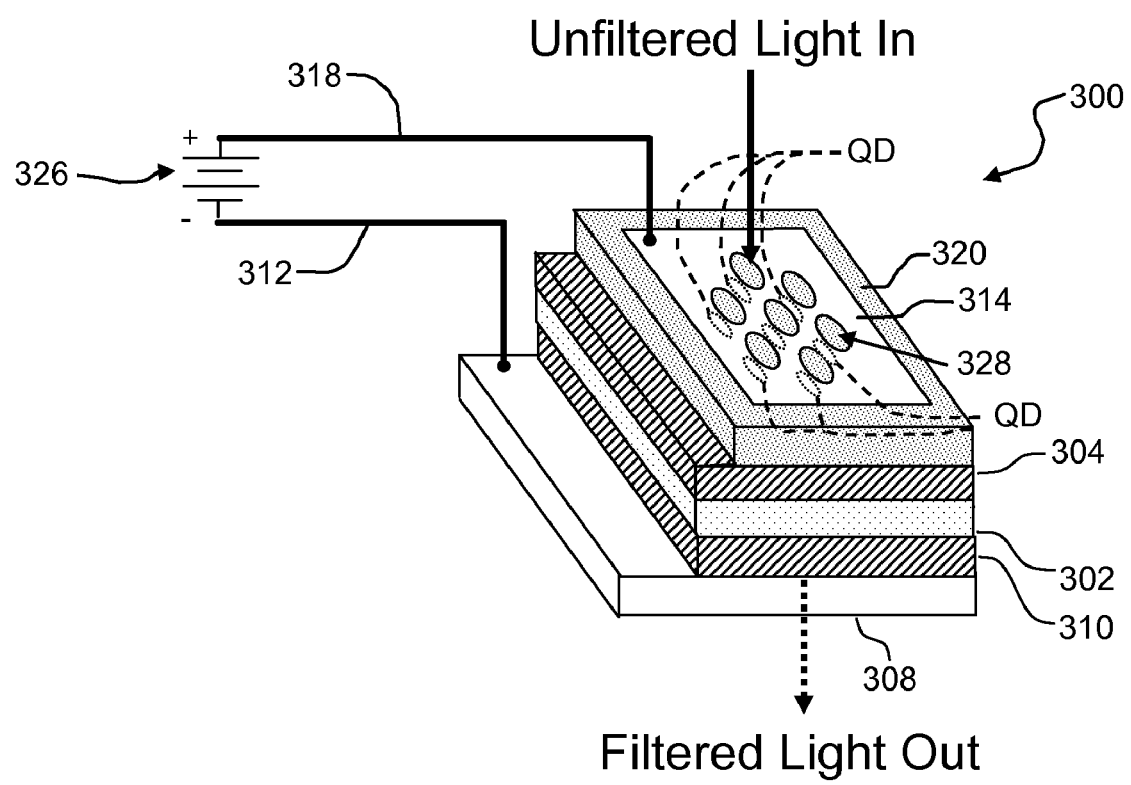
FIG. 3 is a schematic representation of another implementation of a tunable filter, incorporating electrostatic quantum dot devices that partition the quantum well with an electric field, producing lateral confinement that increases the quantum confinement energy of the confined charge carriers and thus the optical cut-on frequency of the quantum well.

FIG. 3 illustrates an electrostatic tunable filter device 300. The principle is exactly the same as in FIG. 1, with a quantum well layer 302 surrounded by barrier layers 304 and 310, except that an optional insulating layer 320 has been added to the top of the tunable filter device 300 in order to electrically isolate the quantum confinement structures. Further, a control system for regulating an electric field across the quantum well layer 302 and barrier layers 304 may be a part of the filter device 300. The control system may include a surface electrode 314 with multiple openings 328 positioned on top of the insulating layer 320. These openings 328 may be physical voids in the electrode material 314, e.g., filled with ambient air, vacuum, or liquid, or they may be composed of some other material that is less conductive than the electrode material 314. For example, the surface electrode 314 may be a grid formed, e.g., by a metal plate interrupted by a regular pattern of milled pits through which electrons cannot easily conduct. Alternatively, the surface electrode 314 may be a low-bandgap semiconductor interrupted by a regular pattern of local oxidation, where the oxide has a higher bandgap than the semiconductor and thus impedes the entry or passage of electrons.

If the openings 328 are smaller than or comparable to the de Broglie wavelength of the confined charge carriers, then lateral quantum confinement effects will be observed within the quantum well 302 when the surface electrode 314 is charged through the application of a voltage 326 between the electrode 314 and a transparent ground plane 308 by electrode leads 312, 318. Specifically, a respective quantum dot QD may be formed in the quantum well transport layer 302 between the barrier layers 304 and 310 beneath each opening 328 in the grid electrode 314, by the same principles discussed above. Thus, a plurality of artificial atoms may be created in the tunable filter device 300 corresponding to each opening 328 in the grid electrode 314.

Such lateral confinement of the charge carriers in the quantum well 302 will increase the quantum confinement energy of the charges carriers, increasing the bandgap-plus-quantum-confinement energy total, and thus altering the cut-on wavelength of the tunable filter device 300. In addition, it should be understood that if the grid openings 328 are deleted from the design, an applied electric field will still alter the quantum confinement energy in the quantum wells 302 via the Stark effect. Thus, regulation of the tunable filter device 300 may be achieved by a control system varying the electric field instead of the temperature. This effect can also be achieved by using a layer of quantum dot particles or devices attached to fibers or wires.

It should also be understood that the methods for forming a grid-shaped electrode are similar to those for forming an electrode of any other shape, and need not be described here. However, a partial list of techniques may include electron beam lithography and anodic oxidation lithography using the probe tip of a scanning probe microscope. It should also be noted that certain lithographic processes are particularly well suited for the nano-patterning of macroscopic areas. These include photolithography (particularly extreme ultraviolet or EUV photolithography), atom holography, and nanoimprint lithography, whether directly depositional or relying on the contamination and later developing and stripping of a "resist" layer, lend themselves to the rapid production of large and relatively uniform grids. Other methods, for example, X-ray crystallography, are capable of producing extremely fine interference patterns that may be used to expose a resist and produce grid-like patterns in a metal layer, which may be used to divide a quantum well or heterojunction into quantum dot regions.

In addition there are molecular self-assembly processes such as the anodization of aluminum into alumina, or the glassification of carefully designed diblock copolymers, which create a thin membrane or "mask" of material pierced by a regularly spaced array of vertical pores, typically arranged in a hexagonal symmetry. A milling process such as reactive ion etching (RIE) may then be used to remove the metal directly beneath a pore, while leaving the metal beneath the solid mask intact. These methods for producing the electrode or electrodes of the tunable filter device are also embodiments of the present invention, although this should not be construed as limiting the scope of the invention. A tunable filter device 300 of the type shown in FIG. 3 may be produced by other methods not described here, with no change in its essential function. It should also be understood by a person of ordinary skill in the art that the device as depicted in FIG. 3 can be scaled upward in two dimensions, increasing the number of quantum dots QD almost without limit.

Notably, placing the quantum dots QD close together as shown in FIG. 3 produces constructive interference between the electric fields which produce them, making the fields stronger. This has the effect of decreasing the effective size of the quantum dots QD, and therefore increasing their quantum confinement energy. In many cases this constructive interference acts to produce a tunable filter device 300 that can operate at or above room temperature. Without the constructive interference, the quantum dots QD would be larger, and their energies lower, so that the quantum confinement energy of the trapped charge carriers would be less than the thermal energy of a room-temperature electron, thus making quantum confinement impossible.

In either case, whether constructive interference is required or merely incidental, the close packing of quantum dots QD increases the density of artificial dopants in the quantum confinement layer 302, and therefore alters the optical cut-on energy and thus the properties as an optical filter material. However, if the quantum dots QD are packed too closely, the surface electrode 314 may be easily disrupted by small cracks, impurities, or other flaws in its conductive material, and the device will not function. It should also be noted that there is a maximum and minimum value for the size of the openings 328, as well as the spacing, in order for the electric fields to assume the desired shape for quantum confinement. Thus, the exact behavior of the device under specific environmental conditions is a function of these various dimensions.

In one exemplary form of the invention, the surface electrode 314 may be a 10 nanometer thick layer of gold with a 3 nanometer adhesion layer of titanium beneath it. The barrier layer 304 may be composed of aluminum gallium arsenide approximately 5 nm thick, and the insulator 320 may be the native oxide of that material, which is normally approximately 2 nm thick. The quantum well transport layer 302 may be composed of gallium arsenide and may be 6-12 nm thick. The ground plane 308 may be composed of n-doped gallium arsenide with very low resistivity.

The surface electrode 314 may be patterned by first spin-coating it with a surface treatment consisting of a random copolymer of styrene (S), 4-vinyl benzocyclobutene (BCB), and methyl methacrylate (MMA) with proportions S/BCB/MMA equal to 56/2/42, with an average molecular weight of approximately 35,000, dissolved in the solvent toluene. The device may then be heated in a nitrogen atmosphere and then a diblock copolymer consisting of approximately 70% styrene and 30% MMA, with a molecular weight of approximately 95,000, may be applied by the same spin coating method. The device 300 may then be heated in vacuum beyond the glass cutoff temperature of the polymers, cooled to room temperature, exposed to ultraviolet light, and then rinsed in acetic acid. The resulting polymer membrane has a hexagonal array of pores whose size and spacing is proportional to the molecular weight of the diblock copolymer—in this case approximately 30 nm diameter and 52.5 nm center-to-center spacing.

The device 300 may be placed in a reactive ion etcher to remove the metal beneath the pores, and then the polymer may be stripped off. A mask may then be applied so that the metal electrode 314, and possibly the insulator 320 and upper barrier 304 may be etched away in selected regions with the reactive ion etcher. The input and output electrodes 312, 318 may then be attached to the electrode 314, the confinement layer 302, the upper barrier 304, or the insulator 320, and the ground plane 308 leaving a finished device 300. This method may be used to pattern wafer surfaces from 0.5 cm to 20 cm in diameter with approximately equal difficulty, and may also be used to pattern larger or smaller areas. This example is included for illustrative purposes only and should in no way be construed as limiting in scope.

In another exemplary form, the composition and arrangement of the metal electrode and semiconductor layers is the same, but the surface of the device may be spin-coated with the lithographic resist polymethyl methacrylate (PMMA) and then patterned with an array of holes via anodic oxidation lithography using the probe tip of a scanning probe microscope. The tip is held a few nanometers from the surface and then biased so that an electron beam passes between the tip and the surface, exposing the PMMA resist. The device may then be rinsed with a developer solution that removes the exposed PMMA, leaving behind a polymer mask with hole size and spacing depending on the bias voltage and programmed motion of the probe tip. The device may then be etched and cleaned and the control electrodes attached as in the previous example. A hole diameter of approximately 70 nm, with center-to-center spacing of 74 nm, has been found to work well. An electron microscope may be used in place of a scanning probe microscope for the lithography step, although the "proximity effect" makes it more difficult to place features close together. This description is included for explanatory purposes only and should in no way be construed as limiting in scope.

Figure 4:
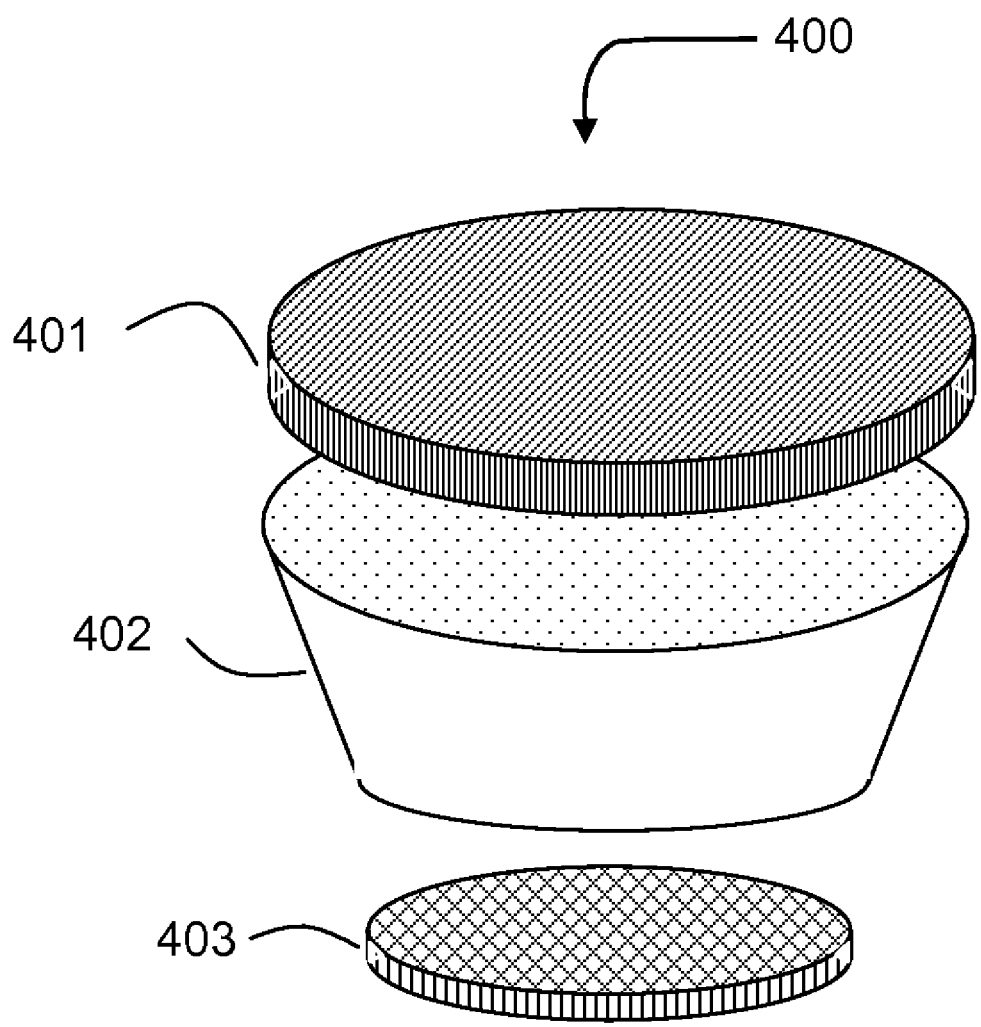
FIG. 4 is a schematic representation of an implementation of a multifunctional optical sensor including a photodetector, which is sensitive to a particular range of electromagnetic wavelengths, a lens to focus incoming light on the detector, and a tunable optical filter.

FIG. 4 is a schematic representation of a multifunctional sensor 400, comprising a photodetector or plurality of photodetectors 403, a lens 402 to focus incoming light on the photodetector 403, and a tunable filter 401 to restrict the range of wavelengths capable of reaching the photodetector 403. In general, the photodetector 403 will respond to any photons within a broad range of energies, depending on its composition and design. The purpose of the lens 402 is either to concentrate incoming light for easier detection or to focus it onto the photodetector array 403, e.g., to produce a clear image in an imaging sensor such as a CCD camera. For some applications the lens 402 may be unnecessary, although its presence will not degrade the performance of the sensor 400 as long as the lens 402 is transparent to all of the wavelengths to which the photodetector 403 is expected to respond and does not otherwise reduce the amount of light reaching the photodetector 403.

The multifunctional sensor 400 may be operated by first adjusting the cut-on wavelength of the tunable filter 401 by controlling its temperature or electric field through a control system as described above. In the most general case, the tunable filter 401 may combine the functions exemplified in FIGS. 1 and 3 above, so that the cut-on wavelength may be adjusted through a combination of thermal and electric field control. This not only maximizes the tunable range of the tunable filter 401, but also permits the material forming the electrically tunable filter 401 to maintain a constant bandgap even in an environment (e.g., outer space) where significant temperature excursions can be expected.

In the simplest case, the multifunctional sensor 400 may then be operated by capturing a single signal from the photodetector 403, based on the filtered light passing through the tunable filter 401 and lens 402. The resulting detection signal will be a response only to the wavelengths passed through by the tunable filter 401, not the ones blocked by it.

In a more general case, the sensor 403 may be operated by capturing successive signals from the photodetector array 403 using different settings of the tunable filter 401. Where the light or scene being imaged is constant, but the amount of light reaching the detector 403 varies as a function of the cut-on wavelength of the filter 401, the user can then extract considerable information about the spectrum of the incoming light, i.e., its varying intensity as a function of wavelength. This in turn provides information about the composition of the objects or light sources being imaged, which can be processed by computing hardware external to the sensor 400.

In the prior art this spectral analysis is generally accomplished with a filter wheel that rotates a succession of different static filters in front of an imaging sensor. Occasionally, for narrow-field-of-view applications, the same effect is accomplished with a Fabry-Perot interferometer or etalon. In both cases, moving parts are required, with all the attendant reliability problems. In contrast the present invention permits such hyperspectral analysis with a completely solid-state device.

Where the photodetector 403 is an imaging sensor such as a CCD camera, successive images taken with different filter settings may provide detailed spectral information for every pixel of the image, enabling detailed and sophisticated analysis of a scene. This is useful, for example, in robotic space probes attempting to analyze the composition of various landscape features. This principle can also be applied to create, for example, a single sensor 400 that, by changing its wavelength response at different times, combines the functions of a spacecraft's star sensor, sun sensor, Earth horizon sensor, and general-purpose imaging sensor, thus reducing the number of sensors required by a single spacecraft. Once again, this may require computational or analytic hardware external to the sensor 400.

Figure 5:
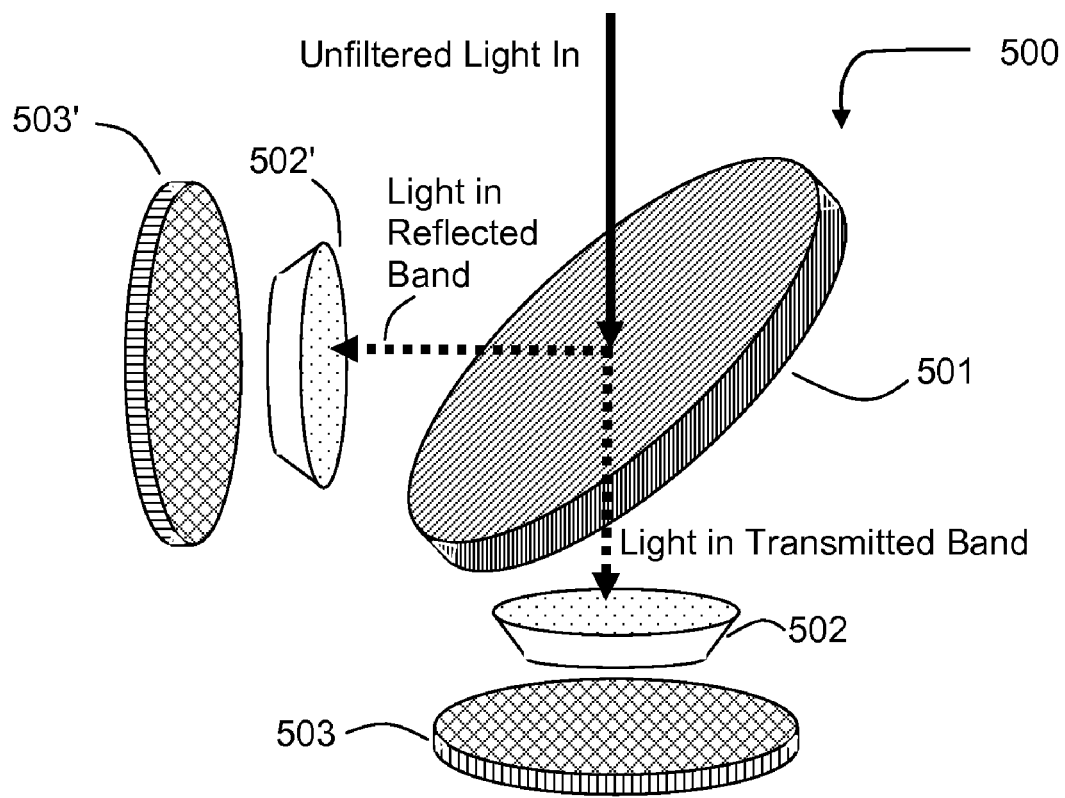
FIG. 5 is a schematic representation of an implementation of an optical sensor where reflected wavelengths are captured by one detector and transmitted wavelengths are captured by another.

FIG. 5 depicts an embodiment of an optical sensor device 500 wherein the tunable filter 501 is angled with respect to the incoming light. In some embodiments, this angle may be 45 degrees, but other angles are possible with no alteration to the basic functioning of the optical sensor 500. As in FIG. 4, the light transmitted by the tunable filter 501 passes through the lens 502 to the detector 503. However, the tunable filter 501 may be constructed and/or adjusted such that it reflects light in a specified wavelength band, whereby the reflected light is then focused through lens 502' to detector 503'. This allows the tunable filter 501 to serve as both a notch filter (to block wavelengths in a first particular band) and a bandpass filter (to transmit wavelengths in a second particular band). It should be understood that if the detection of only one of these two signals were desired, the other lens and detector could be removed.

In the interests of concision, the term "optical" has been used throughout this document, even though it excludes other electromagnetic spectra including long-wavelength infrared, microwaves, radio waves, extreme ultraviolet, x-ray, and gamma radiation. However, it will be apparent to a person skilled in the art that if the filter materials, quantum confinement dimensions, lens materials and photodetector hardware are selected such that the resulting sensor has both a cut-on wavelength and a detection capability in one of these electromagnetic bands, the multifunctional sensor will still function as described above, even though the radiation is not "optical" per se. It should also be noted that some materials (e.g., mercury, vanadium dioxide) behave as conductors at higher temperatures and as semiconductors at lower temperatures. Since conductors generally reflect light rather than absorb it, a quantum well layer composed of such a material would, above the conductivity threshold temperature of the material, suddenly become reflective. This is a thermochromic optical property and, where incorporated into the filter of a multifunctional sensor, is explicitly considered an alternate embodiment.

From the description above, a multifunctional sensor may be understood to provide a number of new capabilities. Specifically, the multifunctional sensor incorporates a tunable electromagnetic filter that can regulate the flow of light based on the temperature of the filter material and/or an applied electric field, within a range specified by the composition and internal structure of the tunable filter, in a completely solid-state package. Unlike tunable filters which rely on piezoelectric actuators for mechanical rotation or deformation, the tunable filter described herein contains no moving parts other than photons and electrons and is therefore more compact and more robust than prior known tunable filters. Thus, the multifunctional sensor may be smaller, more capable, and more reliable than any prior known, comparable device.

The multifunctional electromagnetic sensor may also be fully programmable, i.e., its light-detection and analysis capabilities properties may be controlled externally, through the application of electrical energy to the heaters, coolers, and electrodes, or through command signals to temperature controller or voltage controller circuits.

The electromagnetic sensor may include a simple photodetector, but may also be a complex imaging sensor (for example, a CCD digital camera). The addition of a tunable filter to an imaging sensor makes it a multispectral or hyperspectral sensor, capable of measuring the emission or reflection spectrum of the objects or materials it is imaging, and thus gaining significant information about their composition, temperature, or (in the case of manmade devices) their design and operation. Also, unlike an etalon filter, the solid-state, tunable filter does not restrict the field of view of the multifunctional sensor, but operates over the entire field of view of the instrument, as defined by its apertures and lenses.

The electromagnetic sensor is also capable of achieving specific cut-on energies that do not correspond with the bandgap of any known material, and thus may be difficult to achieve through any other means. In addition, as a side effect of its composition and structure, the multifunctional sensor which may also be capable of generating light (for example, when fluorescing in response to short-wavelength light), or generating electricity from incident light (e.g., via the photoelectric effect), in addition to its normal function as a tunable optical filter.

The electromagnetic sensor also provides a multifunctional, tunable optical sensor that may be constructed entirely out of solid state components. This allows it to have a smaller mass and volume than a comparable system incorporating electromechanical or piezoelectrically actuated filters, and offers greatly improved resistance to shock, vibration, wear, fatigue, particulate interference, gumming of lubricants, and other forms of spontaneous mechanical failure.

Although the description above contains many specificities, these should not be construed as limiting in scope, but rather construed as merely providing illustrations of certain exemplary embodiments. There are various possibilities for making a tunable filter of different materials (including insulators, semiconductors, conductors, or superconductors) and in different configurations. There are particular advantages to using higher bandgap materials, as they not only allow for energetically "deeper" quantum confinement devices, but in many cases also allow the well and barriers to be transparent to light of higher energies and shorter wavelengths.

Numerous other variations exist which do not affect the core principles of the invention's operation. For example, the shape of the tunable filter need not be planar as shown in the figures, but could be in the form of flexible sheets, ribbons, or fibers with quantum dot devices on one or both surfaces, or formed into or around solid shapes including, but not limited to, cylinders, spheres, cones, prisms, and polyhedrons, both regular and irregular, asymmetric forms, and other two- and three-dimensional structures. The quantum well layers could be replaced with layers of quantum dots or quantum wires. It is also conceivable to grow the tunable filter on the inside surface of a complex, porous, or "spongy" material/structure such as an acrogel. The filter could include multiple input pathways (to serve as, for example, a mixer or signal combiner) or multiple output pathways (to serve as, for example, a signal splitter or diverter), or both.

Although various embodiments of this invention have been described above with a certain degree of particularity, or with reference to one or more individual embodiments, those skilled in the art could make numerous alterations to the disclosed embodiments without departing from the spirit or scope of this invention. All directional references e.g., proximal, distal, upper, lower, upward, downward, left, right, lateral, front, back, top, bottom, above, below, vertical, horizontal, clockwise, and counterclockwise are only used for identification purposes to aid the reader's understanding of the present invention, and do not create limitations, particularly as to the position, orientation, or use of the invention. Connection references, e.g., attached, coupled, connected, and joined are to be construed broadly and may include intermediate members between a collection of elements and relative movement between elements unless otherwise indicated. As such, connection references do not necessarily imply that two elements are directly connected and in fixed relation to each other. It is intended that all matter contained in the above description or shown in the accompanying drawings shall be interpreted as illustrative only and not limiting. Changes in detail or structure may be made without departing from the basic elements of the invention as defined in the following claims.

What is claimed is:

1. An electromagnetic sensor comprising
    a solid-state, tunable filter that selectively blocks wavelengths of electromagnetic energy further comprising
        a filter material comprising one or more quantum confinement structures with a collective bandgap; and
        a control system that selectively regulates and controls the bandgap of the filter material to maintain or adjust a transition wavelength between opacity and transparency to the electromagnetic energy; and
    a photodetector that detects filtered wavelengths of electromagnetic energy from the tunable filter.

2. The electromagnetic sensor of claim 1, wherein the filtered wavelengths are multispectral.

3. The electromagnetic sensor of claim 1, wherein the filtered wavelengths are hyperspectral.

4. The electromagnetic sensor of claim 1, where in the tunable filter is a long-pass filter.

5. The electromagnetic sensor of claim 1, wherein the tunable filter is operable within an optical bandwidth.

6. The electromagnetic sensor of claim 1 further comprising a lens that focuses the filtered wavelengths of electromagnetic energy from the tunable filter before detection by the photodetector.

7. The electromagnetic sensor of claim 6 further comprising
    a second lens positioned to intercept a band of the electromagnetic energy reflected by the tunable filter; and
    a second photodetector that detects the reflected band of electromagnetic energy.

8. The electromagnetic sensor of claim 1, wherein the control system further comprises a temperature control system that adjusts the bandgap in real time through control of the temperature of the filter material and thereby adjusts the transition wavelength.

9. The electromagnetic sensor of claim 8, wherein the tunable filter transmits a first portion of the electromagnetic energy as a bandblock filter and reflects a second portion of the electromagnetic energy as a bandpass filter.

10. The electromagnetic sensor of claim 1, wherein the control system further comprises an electric field generator that adjusts the bandgap in real time through control of an electric field applied across the filter material and thereby adjusts the transition wavelength.

11. The electromagnetic sensor of claim 10, wherein the electric field generator creates a Stark effect in the wavelengths of electromagnetic energy transmitted by the filter material and the tunable filter thereby acts as a bandpass filter.

12. The electromagnetic sensor of claim 10 further comprising
    an electrode that creates a patterned electric field across the filter material, whereby the quantum confinement structures comprise quantum dots; and wherein
    the transition wavelength is adjusted by an increase in quantum confinement energy of the filter material by the patterned electric field.

13. The electromagnetic sensor of claim 1, wherein the quantum confinement structure further comprises multiple quantum well layers of identical or varying thickness and composition.

14. The electromagnetic sensor of claim 1, wherein the quantum confinement structure further comprises one or more layers incorporating quantum wires, quantum dots, or both.

15. A method for sensing electromagnetic waves comprising
    passing electromagnetic energy through a quantum confinement structure defining a bandgap designed to place a transition wavelength at a particular value for a particular reference temperature;
    altering the bandgap of the quantum confinement structure to consequently alter the transition wavelength;
    detecting filtered wavelengths of electromagnetic energy received from the quantum confinement structure.

16. The method of claim 15, wherein the adjusting operation further comprises adjusting an electric field across the quantum confinement structure to alter the bandgap.

17. The method of claim 15, wherein the adjusting operation further comprises adjusting a temperature of the quantum confinement structure to alter the bandgap.

18. The method of claim 15 further comprising focusing the filtered wavelengths through a lens before the detecting operation.

19. The method of claim 15, wherein the passing operation further comprises passing the electromagnetic energy through multiple quantum well layers of identical or varying thickness and composition.

20. The method of claim 15, wherein the passing operation further comprises passing the electromagnetic energy through one or more layers incorporating quantum wires, quantum dots, or both.

21. An optical sensor comprising
a solid-state, tunable long-pass filter that selectively blocks and transmits optical wavelengths further comprising
a filter material comprising one or more quantum confinement structures with a collective bandgap; and
a control system that selectively regulates and controls the bandgap of the filter material to maintain or adjust a cut-on wavelength between opacity and transparency to the optical wavelengths;
a lens that focuses the optical wavelengths transmitted from the tunable filter; and
a photodetector that detects the transmitted optical wavelengths from the tunable filter.

22. A solid-state electromagnetic filter comprising
a filter material comprising one or more quantum confinement structures with a collective bandgap; and
a control system that selectively regulates and controls the bandgap of the filter material to maintain or adjust a transition wavelength of the filter material between opacity and transparency to the electromagnetic energy.

23. A method of dynamically and selectively filtering electromagnetic waves comprising
passing electromagnetic waves through a quantum confinement structure defining a bandgap designed to place a transition wavelength at a particular value for a particular reference temperature;
altering the bandgap of the quantum confinement structure to consequently alter the transition wavelength.

* * * * *